(12) United States Patent
Tahara

(10) Patent No.: US 8,356,998 B2
(45) Date of Patent: Jan. 22, 2013

(54) PORTABLE INFORMATION PROCESSING DEVICE

(75) Inventor: Katsutoshi Tahara, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/250,071

(22) Filed: Sep. 30, 2011

(65) Prior Publication Data

US 2012/0087057 A1    Apr. 12, 2012

(30) Foreign Application Priority Data

Oct. 8, 2010 (JP) .................................. 2010-228900
Apr. 22, 2011 (JP) .................................. 2011-096260

(51) Int. Cl.
*H01R 4/66* (2006.01)

(52) U.S. Cl. .......................................................... 439/66
(58) Field of Classification Search ....................... 439/92
See application file for complete search history.

(56) References Cited

U.S. PATENT DOCUMENTS

| 5,163,849 | A | * | 11/1992 | Fogg et al. | 439/497 |
| 5,169,324 | A | * | 12/1992 | Lemke et al. | 439/101 |
| 5,594,622 | A | * | 1/1997 | Hosoya et al. | 361/679.43 |
| 5,919,063 | A | * | 7/1999 | Wang | 439/607.01 |
| 6,347,948 | B1 | * | 2/2002 | Hwang | 439/92 |
| 7,318,757 | B1 | * | 1/2008 | Minich | 439/701 |
| 2004/0030818 | A1 | | 2/2004 | Chen et al. | |

FOREIGN PATENT DOCUMENTS

| JP | 2004-078879 | 3/2004 |
| JP | 2007-193523 | 8/2007 |

\* cited by examiner

*Primary Examiner* — Jean Duverne
(74) *Attorney, Agent, or Firm* — SNR Denton US LLP

(57) ABSTRACT

A portable information processing device includes a circuit board portion that has a main body portion side board mounting an electronic circuit thereon and forming a main body portion, and a connector portion side board forming a connector portion for connection to electronic equipment, wherein the main body portion side board mounts an electronic circuit on at least one of a first surface and a second surface opposite to the first surface, and is provided with a main body portion side electro-static discharge line which functions as an electro-static discharge surge arrester at an edge portion of a surface on which at least an electronic circuit is mounted, and wherein the connector portion side board is provided with a connector portion side electro-static discharge line which is connected to the main body portion side electro-static discharge line and functions as an electro-static emission portion.

10 Claims, 14 Drawing Sheets

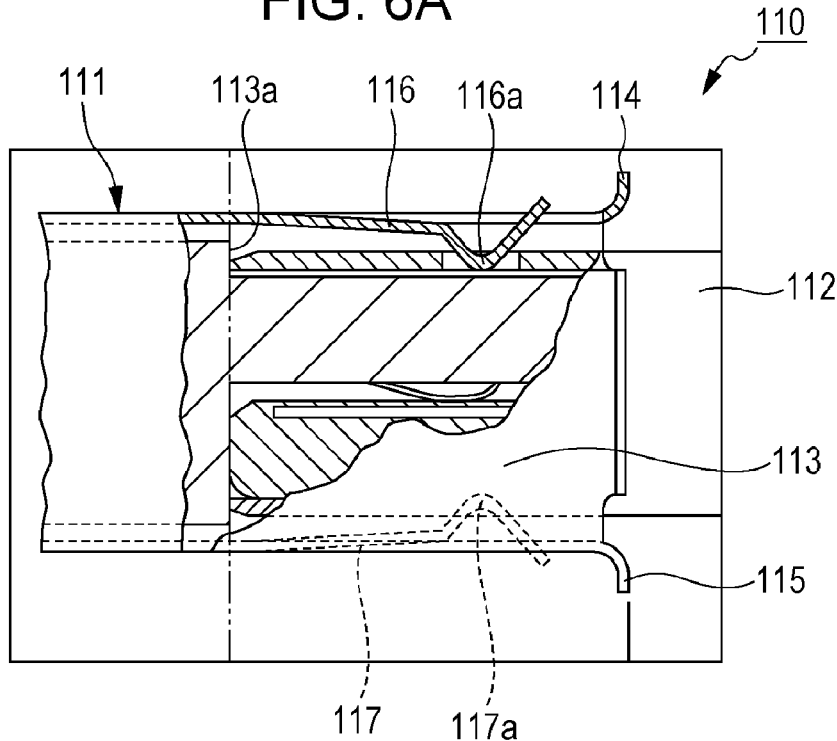
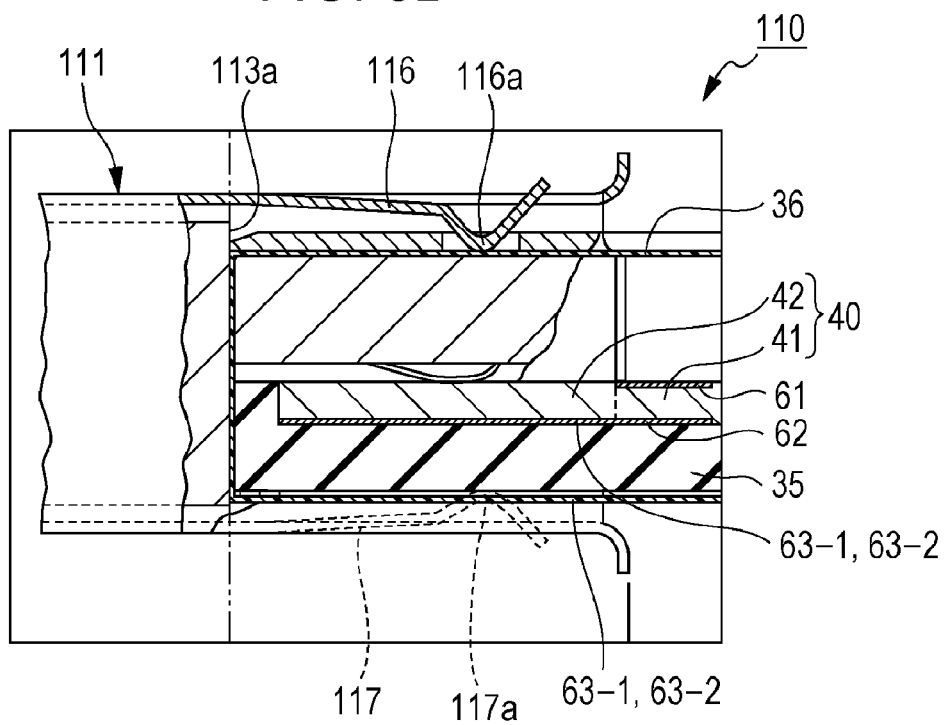

FIG. 16

| PIN No. | SIGNAL | I/O | DESCRIPTION |
|---|---|---|---|
| 21 | GND | | GROUND TERMINAL |
| 20 | PETp0 | I | DIFFERENTIAL DATA INPUT |
| 19 | PETn0 | I | |
| 18 | GND | | GROUND TERMINAL |
| 17 | PERp0 | O | DIFFERENTIAL DATA INPUT |
| 16 | PERn0 | O | |
| 15 | GND | | GROUND TERMINAL |
| 14 | REFCLK+ | I | DIFFERENTIAL REFERENCE CLOCK |
| 13 | REFCLK- | I | |
| 12 | INS# | O | TERMINAL FOR MEDIA DETECTION AND POWER CONTROL TO MEDIA |
| 11 | CLKREQ# | O | CLK CONTROL TERMINAL |
| 10 | +3.3 V | | 3.3 V TERMINAL |
| 9 | PERST# | I | RESET TERMINAL |
| 8 | RESERVED | | |
| 7 | RESERVED | | |
| 6 | RESERVED | | |
| 5 | RESERVED | | |
| 4 | RESERVED | | |
| 3 | RESERVED | | |
| 2 | RESERVED | | |
| 1 | GND | | GROUND TERMINAL |

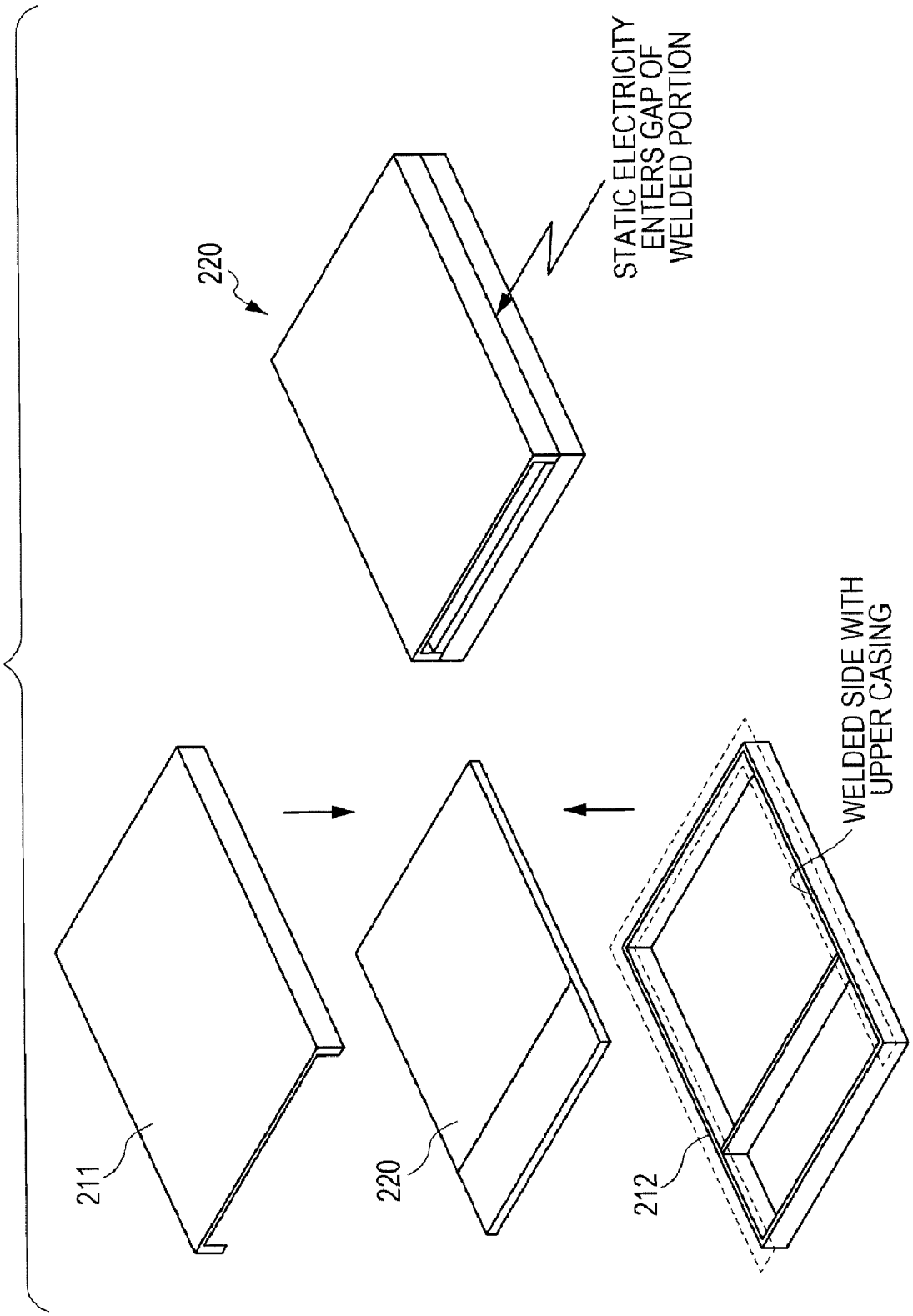

US 8,356,998 B2

PORTABLE INFORMATION PROCESSING DEVICE

BACKGROUND

The present disclosure relates to a portable information processing device which has, for example, a USB (Universal Serial Bus) communication function which is attachable to and detachable from a receptacle of a personal computer (PC) or the like.

As an interface for connecting electronic equipment, such as a PC or the like, to a device, such as a mouse or a keyboard, the USB standard which is a serial interface standard for which the specification is defined by USB-IF (USB-Implementers Forum) has been widely employed.

The USB standard sets a standard A plug as the connection part of a device. As shown in FIG. 1, the standard A plug 1 includes four connection terminals, a circuit ground terminal 2, a circuit power supply terminal 3, a first data communication terminal 4, and a second data communication terminal 5.

The standard A plug 1 is inserted so as to be fitted into a standard A receptacle of a USB mounted on electronic equipment such as a PC, and it is thereby possible to give a connection state (USB connection) based on the USB standard to the electronic equipment as a host and the device.

In addition, in recent years, in accordance with the widespread use of the USB standard in the PCs, portable USB memory devices having a standard A plug 1 at one end side have been widely distributed.

The portable USB memory device (USB device) is inserted so as to be fitted in the standard A receptacle mounted on the PC, and is USB-connected to the PC.

Thereby, the USB memory device stores data sent from the PC or outputs stored data to the PC via the standard A plug 1 in response to a request from the PC (for example, refer to Japanese Unexamined Patent Application Publication No. 2004-78879).

In addition, the USB plug is generally also called a USB connector.

The above-described USB device includes a circuit board portion which integrally mounts electronic circuits such as semiconductor chips with the USB connector thereon. The circuit board portion is contained in a casing made of a molded resin or the like.

In the USB device as well, in order to protect the electronic circuits such as semiconductor chips, countermeasures against electro-static discharge (ESD) are important, and various countermeasures have been proposed (for example, refer to Japanese Unexamined Patent Application Publication No. 2007-193523).

SUMMARY

Meanwhile, in recent years, in USB devices, from the viewpoint of a design, integration with a casing, or the like, a molded resin has been increasingly used for the frame of the USB connector instead of metal.

If there is a path between the frame of the USB connector and the frame of the receptacle of the electronic equipment, ESD does not exert an influence on the circuits in a signal system, and ESD-resistance is increased due to the ESD path.

However, if the mold is used in the frame of the connector, electrical connection with the receptacle disappears, and thus there is a high possibility that an ESD characteristic is lowered.

Specifically, if the mold is used for the frame of the connector, there is no conductive frame ground (a ground connected to the connector frame), and thus ESD which has entered the device may not be released into the frame ground due to the wire connection. For this reason, there is a high possibility that a high voltage caused by ESD may be applied to internal main circuits including a signal ground (different from the frame ground) which is a ground for circuits. As a result, there is a high possibility that operation errors, operation interruptions, damage, and the like may occur due to ESD.

In addition, in a portable device such as a memory card other than the USB device as well, there are cases where the overall casing is made of a molded resin such as polycarbonate, and there is a concern that ESD may exert an influence on the internal circuits in these cases as well.

It is desirable to provide a portable information processing device capable of improving ESD-resistance even in a case where there is no frame ground in a connector portion or a casing.

According to an embodiment of the present disclosure, there is provided a portable information processing device including a circuit board portion that has a main body portion side board mounting an electronic circuit thereon and forming a main body portion, and a connector portion side board forming a connector portion for connection to electronic equipment, wherein the main body portion side board of the circuit board portion has an electronic circuit mounted on at least one of a first surface and a second surface opposite to the first surface, and is provided with a main body portion side electro-static discharge line which functions as an electro-static discharge surge arrester at an edge portion of a surface on which at least an electronic circuit is mounted, and wherein the connector portion side board of the circuit board portion is provided with a connector portion side electro-static discharge line which is connected to the main body portion side electro-static discharge line and functions as an electro-static emission portion, on at least one of the first surface and the second surface.

According to the present disclosure, it is possible to improve ESD-resistance even in a case where there is no frame ground in a connector portion or a casing.

BRIEF DESCRIPTION OF THE DRAWINGS

FIGS. 6A and 6B are diagrams illustrating a schematic configuration of a receptacle of the electronic equipment side.

FIG. 16 is a diagram illustrating an allotment example of the respective terminals (pins) of the terminal portion of the memory card shown in FIGS. 14A to 15.

FIG. 18 is a diagram illustrating an assembling process of the memory card according to the embodiment.

DETAILED DESCRIPTION OF EMBODIMENTS

Hereinafter, embodiments will be described with reference to the drawings.

In addition, the description will be made in the following order.

1. OUTLINE OF OVERALL CONFIGURATION OF USB DEVICE
2. FUNDAMENTAL CONFIGURATION EXAMPLE OF ESD COUNTERMEASURES FOR USB DEVICE
3. DETAILED CONFIGURATION EXAMPLE OF ESD COUNTERMEASURES FOR USB DEVICE
4. OUTLINE OF OVERALL CONFIGURATION OF ANOTHER PORTABLE DEVICE (MEMORY CARD)
5. CONFIGURATION EXAMPLE OF ESD COUNTERMEASURE FOR ANOTHER PORTABLE DEVICE (MEMORY CARD)

1. Outline of Overall Configuration of USB Device

Figure 1:
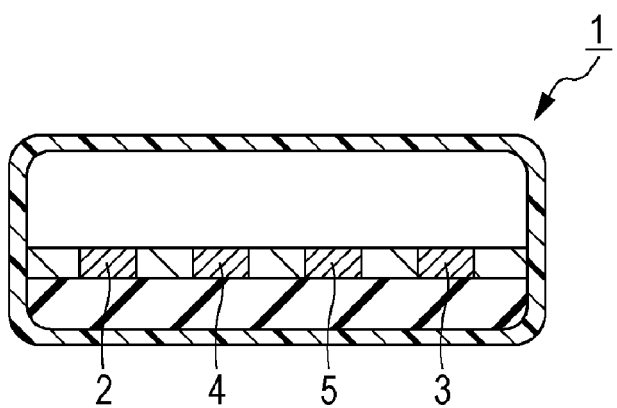
FIG. 1 is a diagram illustrating a schematic configuration of a standard A plug (USB connector) including USB connection terminals.
Figure 2:
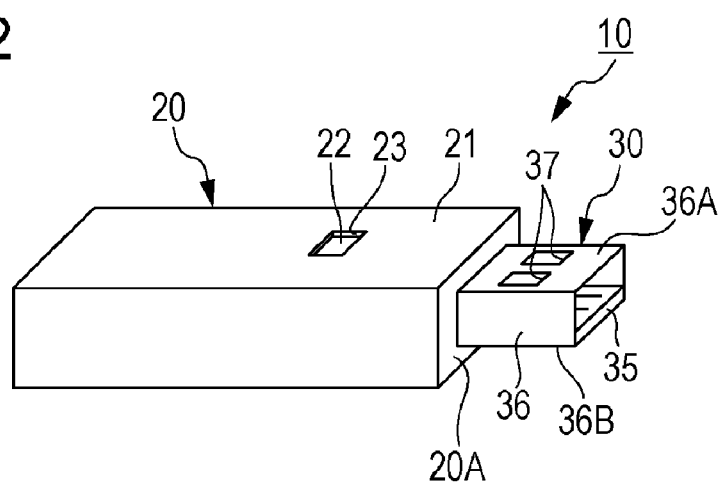
FIG. 2 is a diagram illustrating an outline of an exterior of a USB device which is a portable information processing device according to an embodiment.

FIG. 2 is a diagram illustrating an outline of an exterior of a USB device which is a portable information processing device according to an embodiment.

Figure 3:
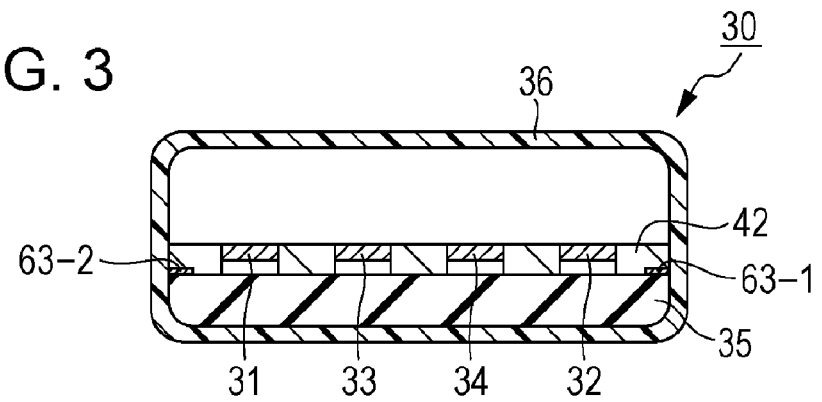
FIG. 3 is a diagram illustrating a schematic configuration of a connector portion of the USB device according to the embodiment.

FIG. 3 is a diagram illustrating a schematic configuration of a connector portion of the USB device according to the embodiment.

Here, as a USB device which is an example of a portable information processing device, a USB memory device mainly having a function of a memory device will be described as an example.

The USB device 10 has a main body portion 20 and a connector portion (connection portion) 30.

The main body portion 20 includes a first casing 21 having a cuboidal shape, which is made of a molded resin, or the like, and the first casing 21 of the main body portion 20 contains a circuit board portion which mounts electronic circuits (electronic components) such as semiconductor chips thereon. The circuit board portion is integrally formed with connection terminals of the connector portion and electrically connected thereto.

In addition, the first casing 21 of the main body portion 20 is provided with a window 23 on a lateral surface (upper surface) such that a display LED 22 mounted on the circuit board portion is visible from outside.

In addition, the window is not necessary in a case where the first casing 21 is optically transparent with respect to the emission colors of the LED 22.

The connector portion 30 is disposed at the one end portion 20A of the main body portion 20 in the longitudinal direction.

As shown in FIG. 3, the connector portion 30 includes four connection terminals, a signal ground terminal 31, a circuit power supply terminal 32, a first data communication terminal 33, and a second data communication terminal 34.

The respective terminals 31 to 34 are integrally formed with the circuit board portion, and are supported by a second casing (back cover) 35 which is a support casing made of a molded resin.

The second casing 35 which is a support casing is also disposed at a tip surface side of a connector portion side board forming a part of the connector portion.

A frame 36 surrounding the entirety of the terminals 31 to 34 and the second casing 35 is formed so as to form a space over the terminals 31 to 34.

The frame 36 is made of a nonconductive material such as a molded resin or a conductive material.

The frame 36 is provided with locking holes 37 in which connector suppressing plate springs of a receptacle side are locked, on a surface (upper surface) 36A and a surface (lower surface) 36B (not shown) opposite to the surface 36A.

Next, a circuit board portion 40 will be described.

Figure 4A:
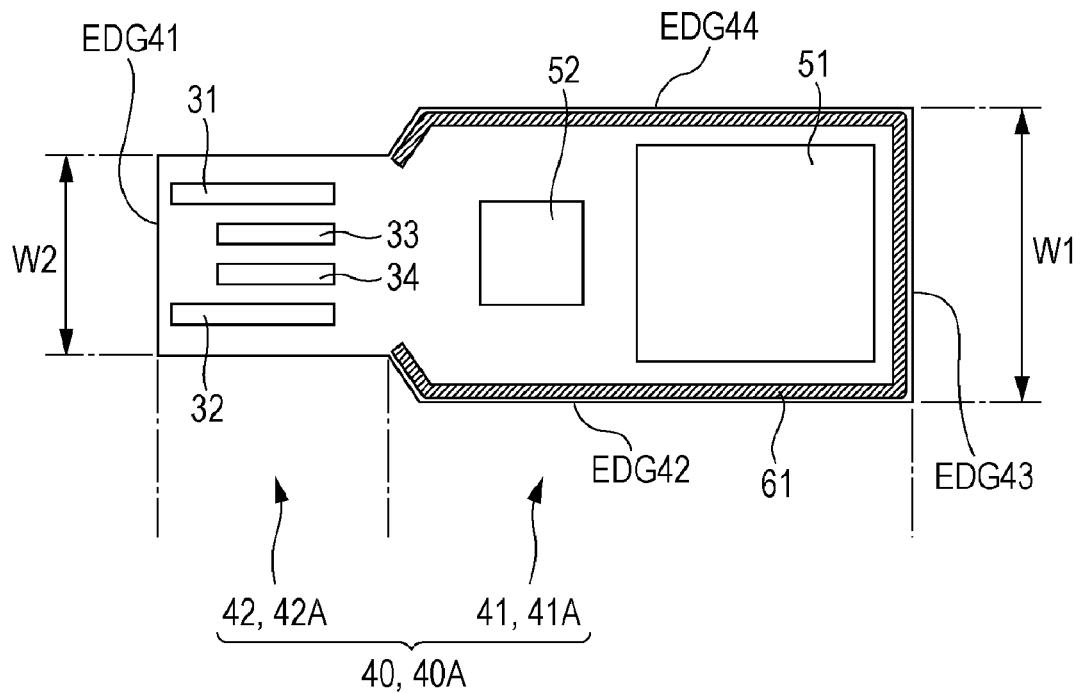
FIGS. 4A and 4B are diagrams illustrating a circuit board portion of the USB device according to the embodiment.
Figure 4B:
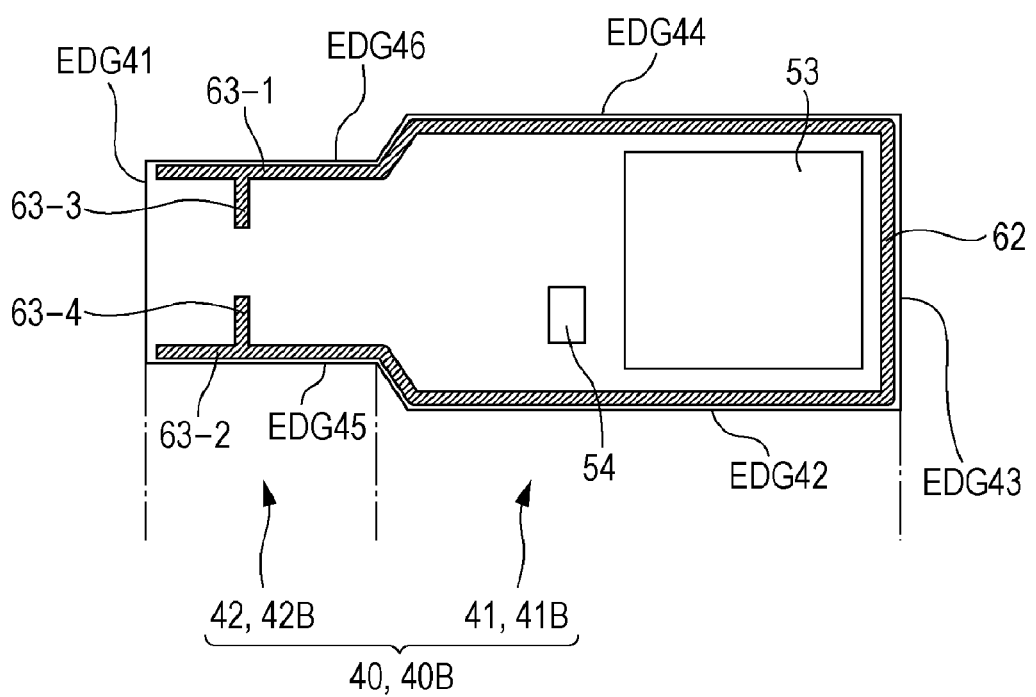

FIGS. 4A and 4B are diagrams illustrating an outline of the circuit board portion of the USB device according to the embodiment. FIG. 4A is a diagram illustrating a schematic configuration of a first surface side, and FIG. 4B is a diagram illustrating a schematic configuration of a second surface side opposite (reverse side) to the first surface.

The circuit board portion 40 is formed by a rectangular printed circuit board (PCB).

The circuit board portion 40 has a main body portion side board 41 and a connector portion side board 42 which are integrally formed with each other. In the circuit board portion 40, the width of the main body portion side board 41 is set to W1, and the connector portion side board 42 is set to have the width W2 smaller than the width W1 of the main body portion side board 41 so as to form a part of the connector portion 30.

In addition, when the end portion of the connector portion side board 42 in the longitudinal direction is a front portion, and the end portion of the main body portion side board 41 in the longitudinal direction is a rear portion, a connection portion between the main body portion side board 41 and the connector portion side board 42 are formed as follows.

The connection portion between the main body portion side board 41 and the connector portion side board 42 are tapered such that the width is gradually reduced from the front portion of the board portion 41 to the rear portion of the board portion 42.

In the circuit board portion 40, electronic circuits (components) 51 and 52 and the like such as semiconductor chips are mounted on the first surface (surface A) 40A of the main body portion side board 41A, and the above-described respective terminals 31 to 34 of the connector portion 30 are formed in parallel on the connector portion side board 42A.

For the terminals 31 to 34, the signal ground (circuit ground) terminal 31 and the circuit power supply terminal 32 are formed up to the vicinity of the front edge EDG41 of the circuit board portion 40 in the longitudinal direction as compared with the first data communication terminal 33 and the second data communication terminal 34.

The respective terminals 31 to 34 are connected to the electronic circuits of the main body portion side board 41A via connection patterns (not shown).

In the main body portion side board 41A, a first ESD line 61 which functions as an ESD surge arrester is formed in a pattern exposed state where there is no resist layer, along the edge portions EDG42 to EDG44 of the board 41A, so as to surround the region mounting the electronic circuits (components) 51 and 52 thereon, and the like.

In addition, the ESD line is not formed at the connector portion side board 42A on the first surface 40A.

In the circuit board portion 40, electronic circuits (components) 53 and 54 and the like such as semiconductor chips are mounted on the second surface (surface B) 40B of the main body portion side board 41B, and the above-described respective terminals 31 to 34 of the connector portion 30 are not formed on the connector portion side board 42B.

In the main body portion side board 41B, a second ESD line 62 which functions as an ESD surge arrester is formed in a pattern exposed state where there is no resist layer, along the edge portions EDG42 to EDG44 of the board 41B, so as to surround the region mounting the electronic circuits (components) 53 and 54, and the like.

In addition, in the second surface 40B, third ESD lines 63-1 and 63-2 which function as an ESD emission portion are formed so as to extend from both end portions of the second ESD line 62 at the edge portions EDG45 and EDG46 of the connector portion side board 42B in the longitudinal direction.

Here, the edges EDG45 and EDG46 in the longitudinal direction are two edge portions located at the sides perpendicular to the direction where the connector portion 30 is inserted into or removed from electronic equipment.

The end portions of the ESD lines 63-1 and 63-2 are formed up to positions opposite to the end portions of the signal ground terminal 31 and the circuit power supply terminal 32 on the first surface 40A.

The ESD line 61 on the first surface 40A and the ESD line 62 on the second surface 40B of the circuit board portion 40 are connected to each other via a through-hole (not shown) in a circuital way (electrically).

In addition, third ESD lines 63-3 and 63-4 are formed to be branched from the central portions of the third ESD lines 63-1 and 63-2 in the longitudinal direction so as to face each other at the board inside of the sides perpendicular to the direction where the connector portion 30 is inserted into or removed from electronic equipment.

As described later, a hole or a notch portion is formed at least one of the ESD lines 63-1 and 63-2 on the second surface 40B of the connector portion side board 42, so as to form an air layer for discharge. The air layer for discharge communicates with an air layer inserted into the lower bound (outside), formed in the second casing 35 which is made of a resin, and a discharge path is formed by the air layers.

In the connector portion side board 42 of the circuit board portion 40, the second surface 40B side is supported by the second casing 35 made of a molded resin as described above.

The second casing 35 as a support casing is also disposed at the tip surface side (front edge EDG41) of the connector portion side board 42 forming a part of the connector portion.

Figure 5:
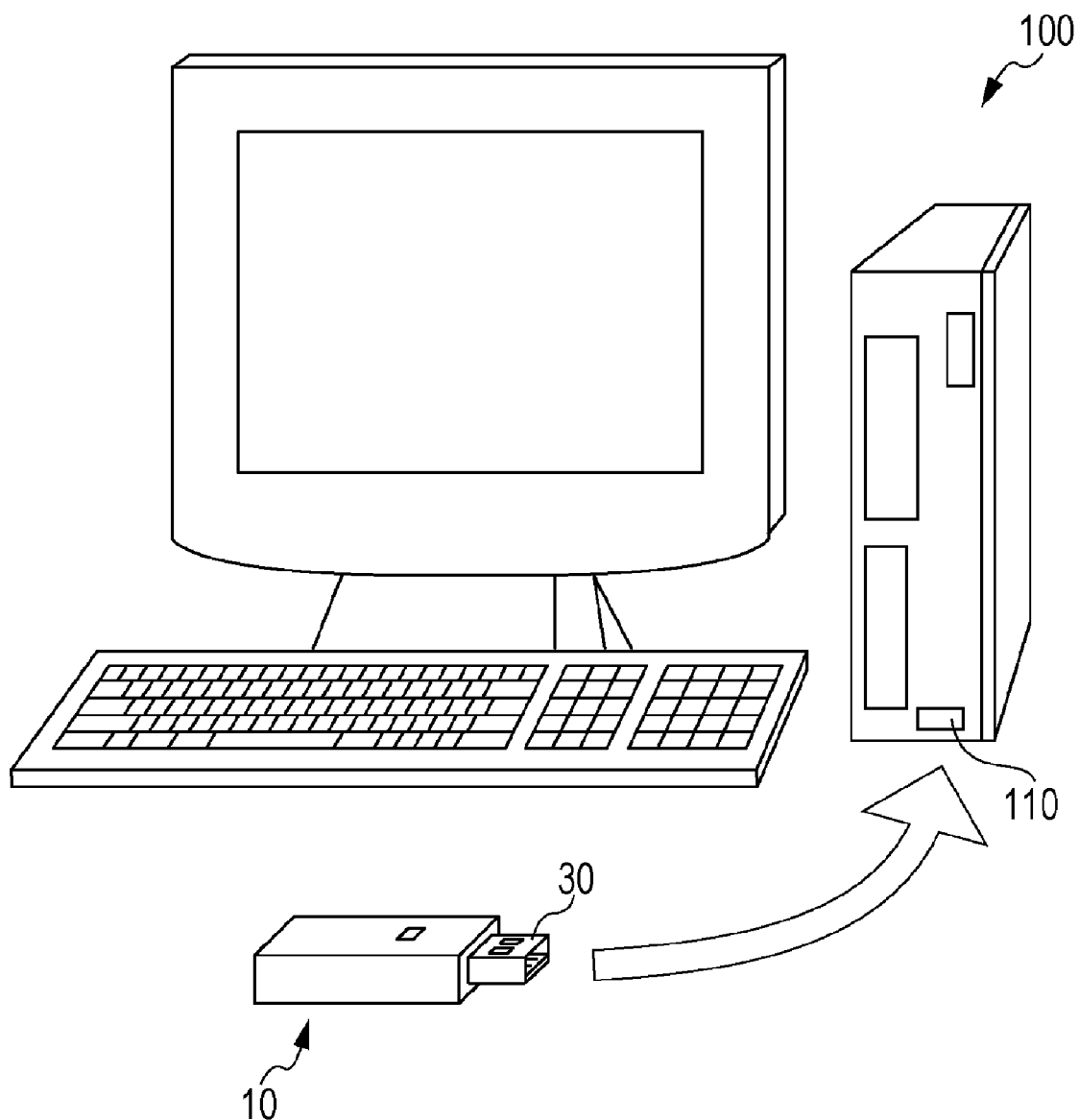
FIG. 5 is a diagram illustrating attachment and detachment of the USB device to and from electronic equipment.

FIG. 5 is a diagram illustrating attachment and detachment of the USB device to and from electronic equipment.

The USB device 10 having the above-described configuration is attached to and detached from electronic equipment 100 such as a PC (personal computer) shown in FIG. 5.

The electronic equipment 100 has a receptacle 110, and the USB device 10 can be physically and electrically connected to the electronic equipment 100 by inserting the connector portion 30 into the receptacle 110 so as to be fitted.

In addition, the USB device 10 can be separated (migrate) from the electronic equipment 100 by pulling the connector portion 30 from the receptacle 110, thereby cancelling the physical and electrical connection state with the electronic equipment.

FIGS. 6A and 6B are diagrams illustrating a schematic configuration of the receptacle of the electronic equipment side.

FIG. 6A is a schematic cross-sectional view illustrating a state where the connector portion is not inserted into the receptacle, and FIG. 6B is a schematic cross-sectional view illustrating a state where the connector portion is inserted into the receptacle.

The receptacle 110 has a conductive boxlike housing 111, and the housing 111 is maintained as (connected to) a predetermined potential, for example, a ground potential. An opening portion 112 into which the connector portion is inserted is formed at the one end portion of the housing 111, and an insertion accommodation portion 113 of the connector portion 30, communicating with the opening portion 112 is formed inside the housing 111.

The front end portion of the connector portion 30 inserted into the insertion accommodation portion 113 comes into contact with a lateral wall (lateral surface) 113a forming the insertion accommodation portion 113 in a connection state, as shown in FIG. 6B. In this example, the tip portion of the second casing 35 which is a support casing comes into contact with the lateral wall 113a.

The housing 111 is provided with an upper flange 114 and a lower flange 115 at the upper side and the lower side of the insertion accommodation portion 113 in the figure.

Parts of the flanges 114 and 115 are notched to form plate spring portions 116 and 117. The plate spring portions 116 and 117 have locking portions 116a and 117a which are locked in the locking holes 37 formed on the surfaces (upper surfaces) 36A and 36B of the frame 36 of the connector portion 30.

2. Fundamental Configuration Example of ESD Countermeasures

Next, a fundamental configuration example of ESD countermeasures according to the embodiment will be described.

The configuration example of the circuit board portion 40 provided with the ESD lines 61, 62, 63-1, 63-2, 63-3 and 63-4 which are a part of the ESD countermeasures has already been described with reference to FIGS. 4A and 4B.

Hereinafter, a description will be made mainly based on a configuration of a discharge path formed to include an air layer which is formed to be connected to the ESD line, particularly, a part of the ESD lines 63-1 and 63-2 formed on the second surface 40B of the connector portion side board 42.

Figure 7A:
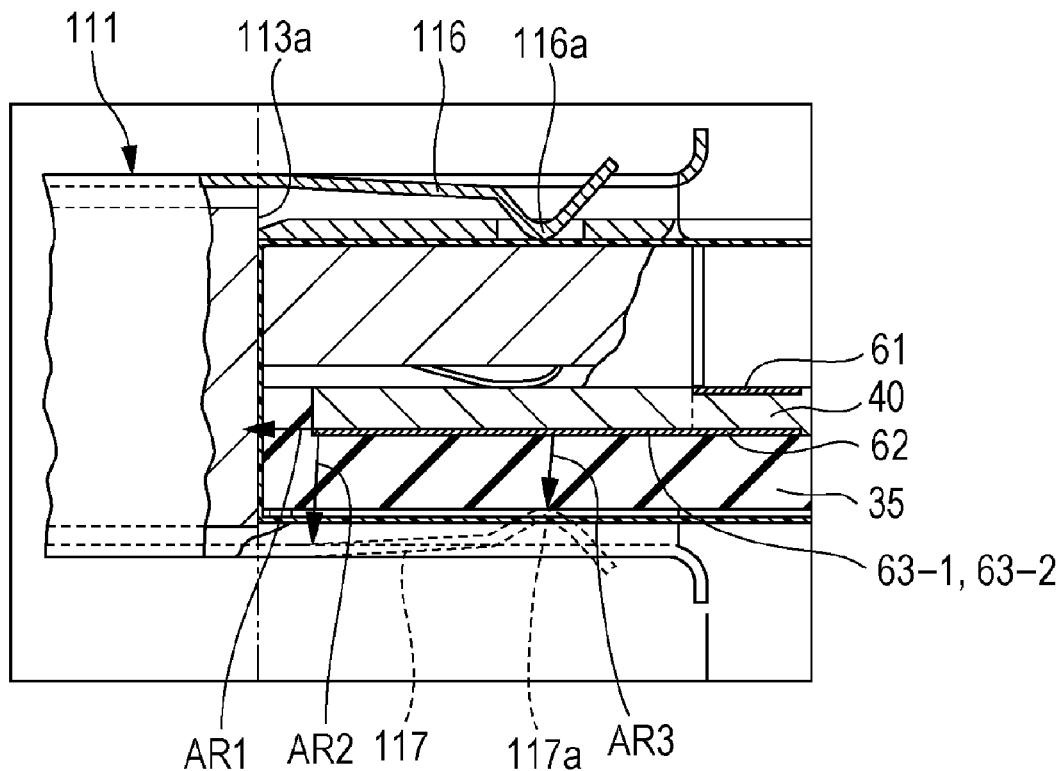
FIGS. 7A and 7B are diagrams illustrating an ESD countermeasure and a discharge path from an ESD line in the USB device according to the embodiment.
Figure 7B:
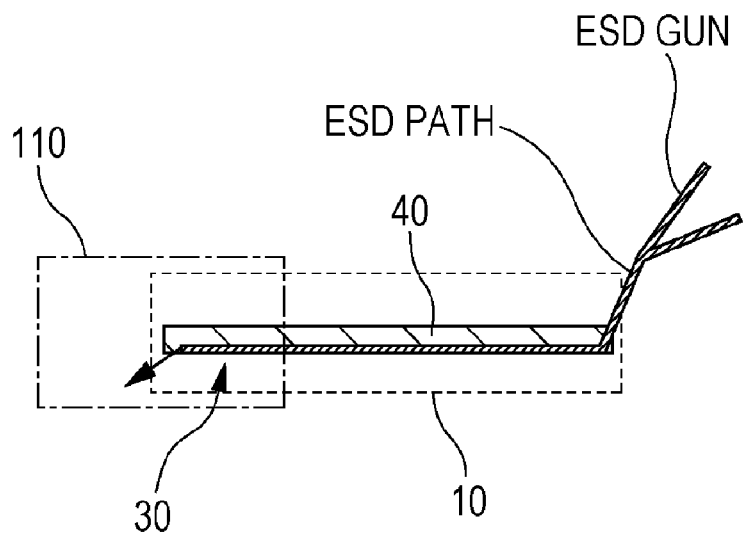

FIGS. 7A and 7B are diagrams illustrating ESD countermeasures and a discharge path from the ESD lines in the USB device according to the embodiment.

FIG. 7A is a diagram illustrating several discharge paths in a state where the connector portion is inserted into the receptacle.

FIG. 7B is a schematic diagram illustrating a state where ESD is discharged to the receptacle via the discharge path through the ESD lines of the PCB.

In the USB device 10, from the viewpoint of a design, integration with a casing, or the like, a molded resin has been increasingly used for the frame of the USB connector instead of metal.

If there is a discharge path between the frame of the USB connector 30 and the frame of the receptacle 110, ESD does not exert an influence on circuits in a signal system, and ESD-resistance is increased due to the path of ESD.

However, if the molded resin is used for the frame of the connector portion 30, electrical connection to the receptacle 110 disappears, and thus there is a high possibility that an ESD characteristic is lowered.

Even if there is a specific distance between two objects of an object A having a high potential and an object B having a low potential, ESD jumps from the object A to the object B. In a case of the USB device which does not use a USB connector with a metal frame, ESD jumps and moves to a place spaced with a specific distance, due to dielectric breakdown. For this reason, the pattern on the PCB and the frame of the receptacle are in an electrical connection due the dielectric breakdown, an ESD path may be formed there, and thus resistance to ESD in the USB device increases.

Therefore, in the embodiment, the exposed ESD line having no resist layer is formed on a path which ESD enters the USB device so as to prevent ESD from falling on the internal circuits, and further an end point of the ESD line is formed up to the connector portion 30. In addition, a hole or a notch is formed at the tip portion (front end portion) of the connector portion 30 so as to form an air layer which is connected to outside in terms of a structure, as indicated by the arrows AR1, AR2, and AR3 in FIG. 7A. Generally, since the breakdown field of air is ⅛ times or less that of a molded resin, the air layer connected to outside is formed, and thereby the breakdown field between the frames of the PCB 40 and the USB receptacle 110 is lowered so as to strengthen the electrical connection.

More specifically, the breakdown field is 30 kV/mm at polycarbonate, 35.5 kV/cm=3.55 kV/mm at air, and 12 kV/mm to 33 kV/mm at generic plastic.

As such, the breakdown field of air is ⅛ times or less that of polycarbonate. In other words, for example, a hole is formed at the second casing (back cover) 35 made of polycarbonate to make a path of air, thereby manufacturing a path where static electricity easily goes to the frame of the receptacle.

In addition, the same theory is also applicable to generic plastic.

Thereby, as shown in FIG. 7B, the path of ESD can be formed by an ESD gun (ESD emission object), the PCB, (ESD jumping), and the USB receptacle 110.

With this, resistance to ESD can be heightened in a frame which is not made of metal.

3. Detailed Configuration Example of ESD Countermeasures

In the embodiment, an electrical path including an ESD gun, (ESD line) other than the main circuits of the PCB, (ESD jumping), and ESD jumping to the frame of the receptacle, is formed as the ESD countermeasure for protecting the circuits (electronic components) on the board.

The following two methods can realize the countermeasures.

1) ESD Surge Arrester and Path

Figure 8A:
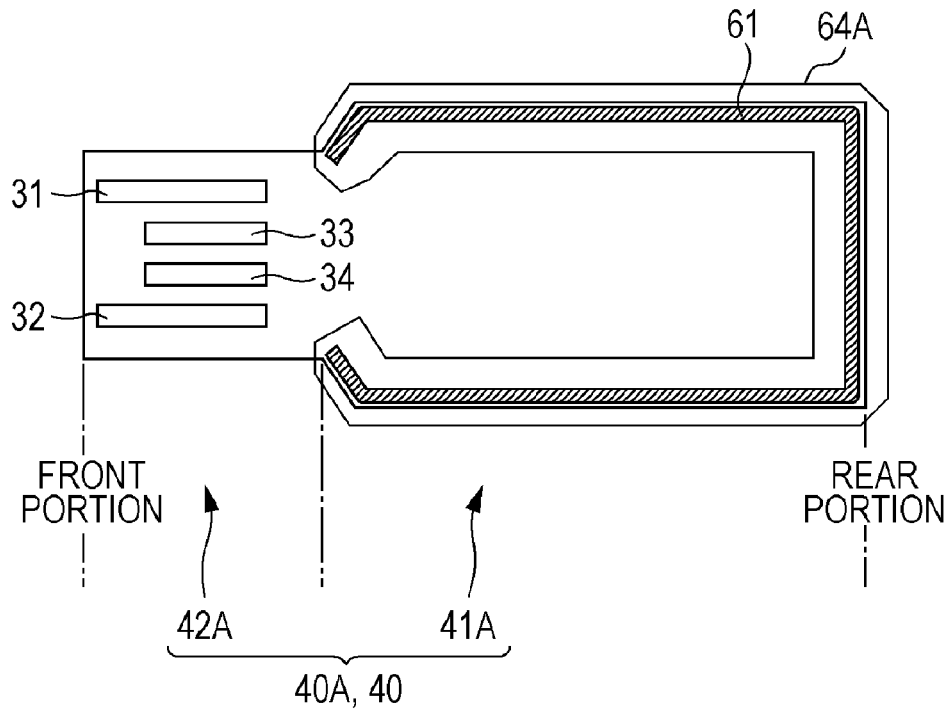
FIGS. 8A and 8B are diagrams more specifically illustrating ESD countermeasures in the circuit board portion according to the embodiment.
Figure 8B:
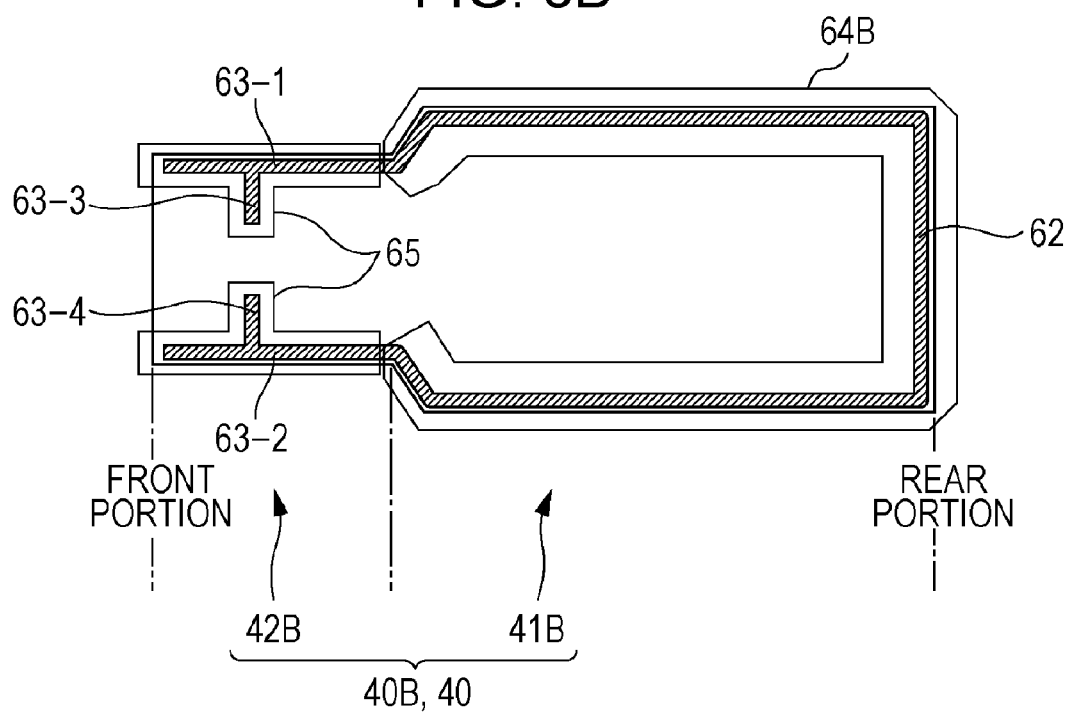

FIGS. 8A and 8B are diagrams more specifically illustrating ESD countermeasures in the circuit board portion according to the embodiment. FIG. 8A is a diagram illustrating a schematic configuration of the first surface side, and FIG. 8B is a diagram illustrating a schematic configuration of the second surface side opposite to the first surface.

Despite the repetition of the description referring to FIGS. 4A and 4B, a configuration example of ESD countermeasures in the circuit board portion 40 will be described below.

In the circuit board portion 40, an exposed pattern having no resist layer is formed at the ESD lines 61 and 62 which are located at so-called mating gaps, regions which ESD enters in advance such as holes in the design, or locations having a short distance to the outside.

The ESD lines 61 and 62 on the first surface (surface A) 40A and the second surface (surface B) 40B are connected to each other in a circuital way. In addition, only on the second surface (surface B) 40B, the ESD line 62 is formed to extend up to the tip (front end portion) of the connector portion 30.

In such a circuit board portion 40, ESD is purposely (intentionally) made to be performed in (falls on) the ESD lines 61 and 62 formed at the main body portion side board 41 of the rear portion side.

That is to say, the ESD lines 61 and 62 formed at the main body portion side board 41 of the rear portion side function as ESD surge arresters 64A and 64B.

In addition, ESD is emitted only from the ESD lines 63-1 and 63-2 on the second surface (surface B) 40B of the connector portion side board 42 of the front portion. That is to say, the ESD lines 63-1 and 63-2 on the second surface (surface B) 40B of the connector portion side board 42 of the front portion side function as an ESD emission portion 65.

2) Discharge Path from PCB (Circuit Board Portion) to Frame of Receptacle

A hole or a notch is formed at a place close to the frame of the receptacle 110 or a path toward the plate spring portion, so as to form an air layer. Thereby, the breakdown field between the PCB and the frame of the receptacle is lowered, and thus ESD can easily jump to the frame of the receptacle 110 from the PCB.

Figure 9:
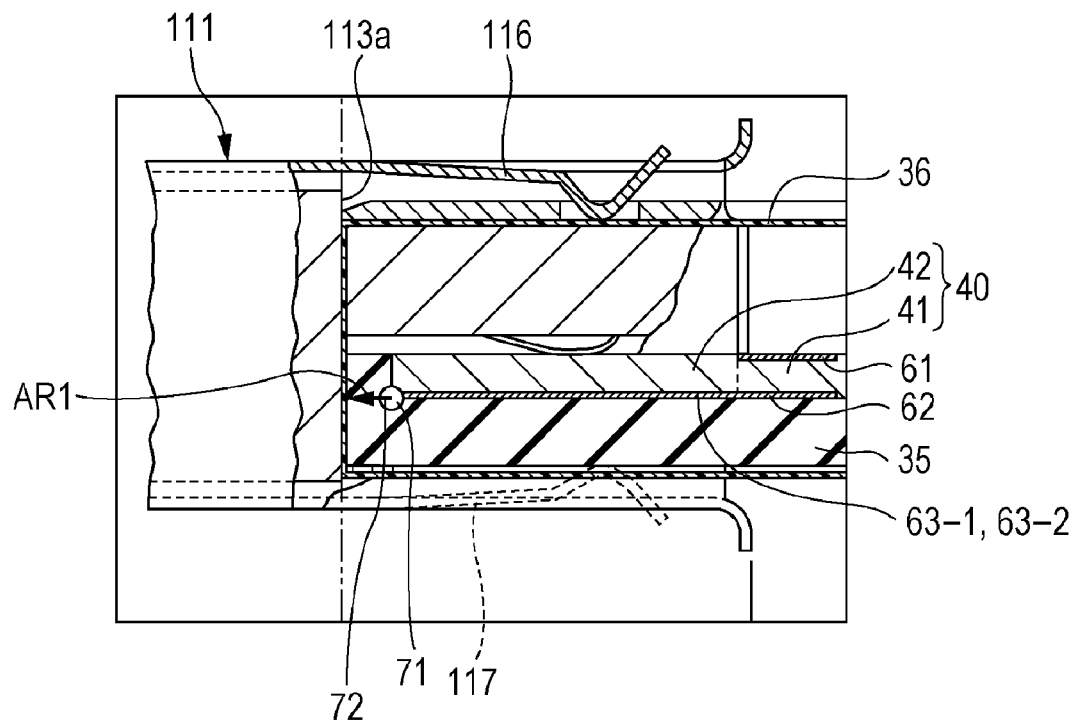
FIG. 9 is a diagram illustrating a configuration example when a hole is formed at a tip portion of the circuit board portion so as to form a discharge path of ESD which leads to a lateral surface inside the receptacle.

FIG. 9 is a diagram illustrating a configuration example when a hole is formed at a tip portion of the circuit board portion so as to form a discharge path of ESD which leads to a lateral surface inside the receptacle.

In the example shown in FIG. 9, a hole 71 is formed in the vicinity of at least one of the end portions of the ESD lines 63-1 and 63-2 of the tip portion formed on the second surface 40B of the connector portion side board 42 of the circuit board portion 40.

A hole 71 is formed at the tip portion of the circuit board portion 40, thereby forming a discharge path 72 of ESD indicated by the arrow AR1, which leads to the lateral surface 113a inside the receptacle 110.

The discharge path 72 is formed via a gap which is generated by, for example, bonding the second casing 35 formed using an insulator. In addition, an air layer forming the discharge path 72 is intentionally formed in the second casing 35.

Thereby, ESD can easily jump to the lateral surface 113a which is the frame of the receptacle 110.

Figure 10:
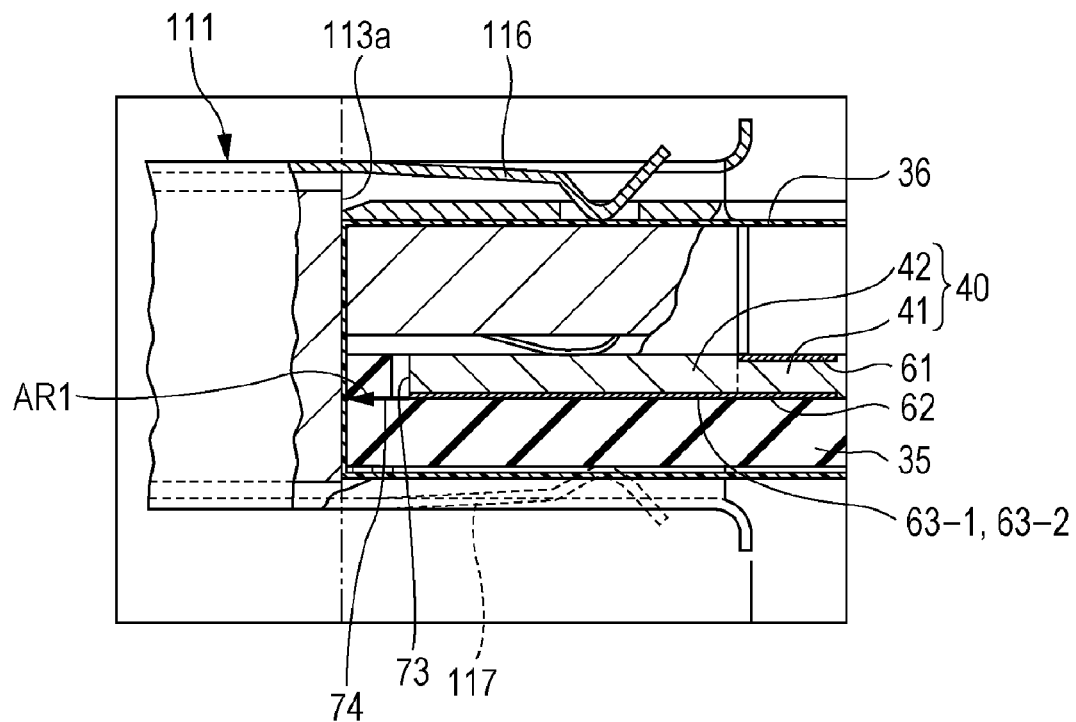
FIG. 10 is a diagram illustrating a configuration example when a notch is formed at the tip portion of the circuit board portion so as to form a discharge path of ESD which leads to the lateral surface inside the receptacle.

FIG. 10 is a diagram illustrating a configuration example when a notch is formed at the tip portion of the circuit board portion so as to form a discharge path of ESD which leads to the lateral surface inside the receptacle.

In the example shown in FIG. 10, a notch 73 is formed in the vicinity of at least one of the end portions of the ESD lines 63-1 and 63-2 of the tip portion formed on the second surface 40B of the connector portion side board 42 of the circuit board portion 40. In this case, a gap between the end portions of the ESD lines 63-1 and 63-2 and the second casing 35 is formed.

The notch 73 is formed at the tip portion of the circuit board portion, thereby forming a discharge path 74 of ESD indicated by the arrow AR1, which leads to the lateral surface 113a inside the receptacle 110.

The discharge path 74 is formed via a gap which is generated by, for example, bonding the second casing 35 formed using an insulator. In addition, an air layer forming the discharge path 74 is intentionally formed in the second casing 35.

Thereby, ESD can easily jump to the lateral surface 113a which is the frame of the receptacle 110.

Figure 11:
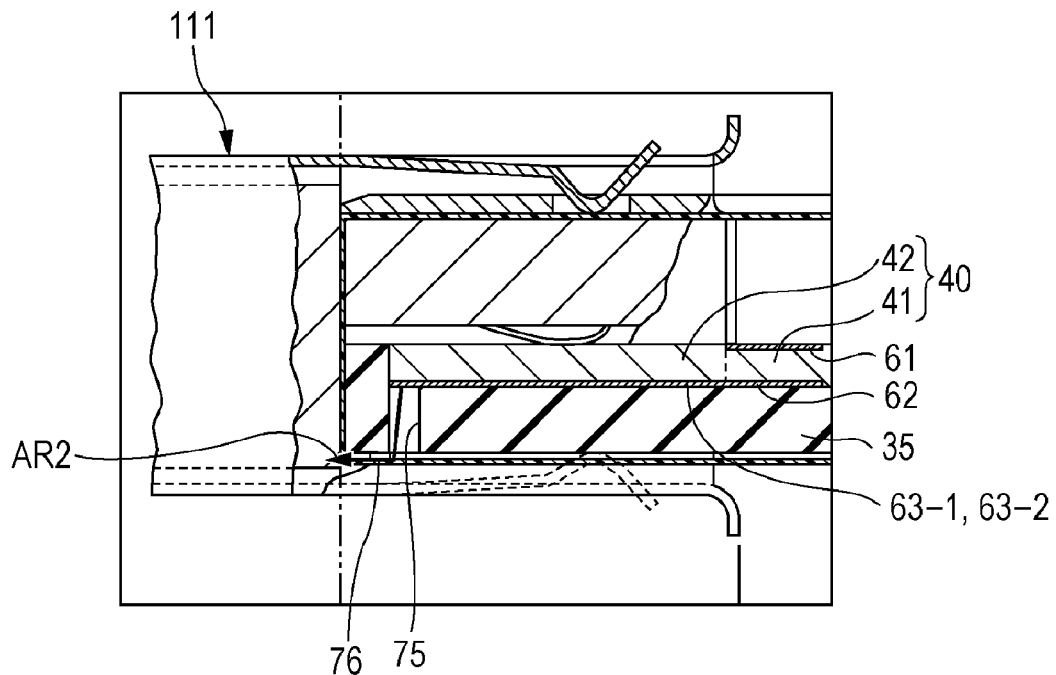
FIG. 11 is a diagram illustrating a configuration example when a penetrating hole is formed at a second casing (support casing) supporting the circuit board portion so as to form a discharge path of ESD which leads to the lateral surface inside the receptacle.

FIG. 11 is a diagram illustrating a configuration example when a penetrating hole is formed at the second casing (support casing) supporting the circuit board portion so as to form a discharge path of ESD which leads to the lateral surface inside the receptacle.

In the example shown in FIG. 11, a hole 75 which downwardly penetrates through the supporting the second casing 35 is formed in at least one side of the ESD lines 63-1 and 63-2 of the tip portion formed on the second surface 40B of the connector portion side board 42 of the circuit board portion 40.

The hole 75 formed in the second casing 35 forms a discharge path 76 of ESD indicated by the arrow AR2, which leads to the lateral surface 113a inside the receptacle 110.

Thereby, ESD can easily jump to the lateral surface 113a which is the frame of the receptacle 110.

Figure 12:
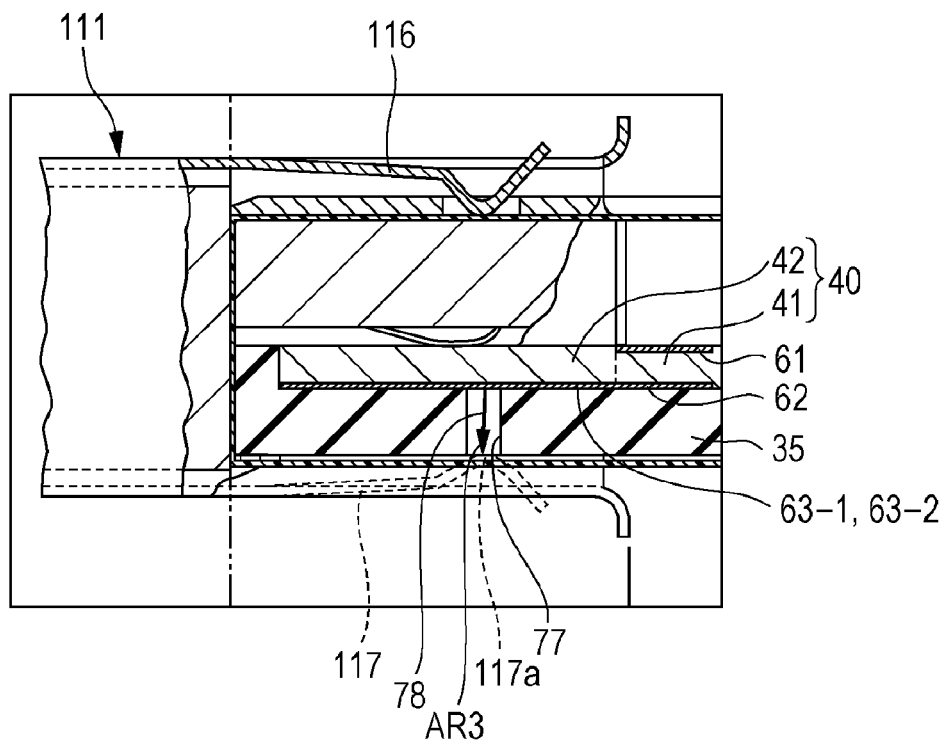
FIG. 12 is a diagram illustrating a configuration example when a penetrating hole is formed so as to correspond to a part where a plate spring portion is locked at the second casing (support casing) supporting the circuit board portion so as to form a discharge path of ESD which leads to the plate spring portion of the receptacle.

FIG. 12 is a diagram illustrating a configuration example when a penetrating hole is formed so as to correspond to a part where a plate spring portion is locked at the second casing (support casing) supporting the circuit board portion so as to form a discharge path for ESD which leads to the plate spring portion of the receptacle.

In the example shown in FIG. 12, a hole 77 which downwardly penetrates through the supporting the second casing 35 is formed in at least one side of the ESD lines 63-1 and 63-2 of the tip portion formed on the second surface 40B of the connector portion side board 42 of the circuit board portion 40. The formation position is a place corresponding to the part where the plate spring portion 117 is locked.

The hole 77 formed in the second casing 35 forms a discharge path 78 of ESD indicated by the arrow AR3, which leads to the plate spring portion 117 of the receptacle 110.

Thereby, ESD can easily jump to the frame of the receptacle 110.

Here, an information processing system of the USB device 10 will be described.

Figure 13:
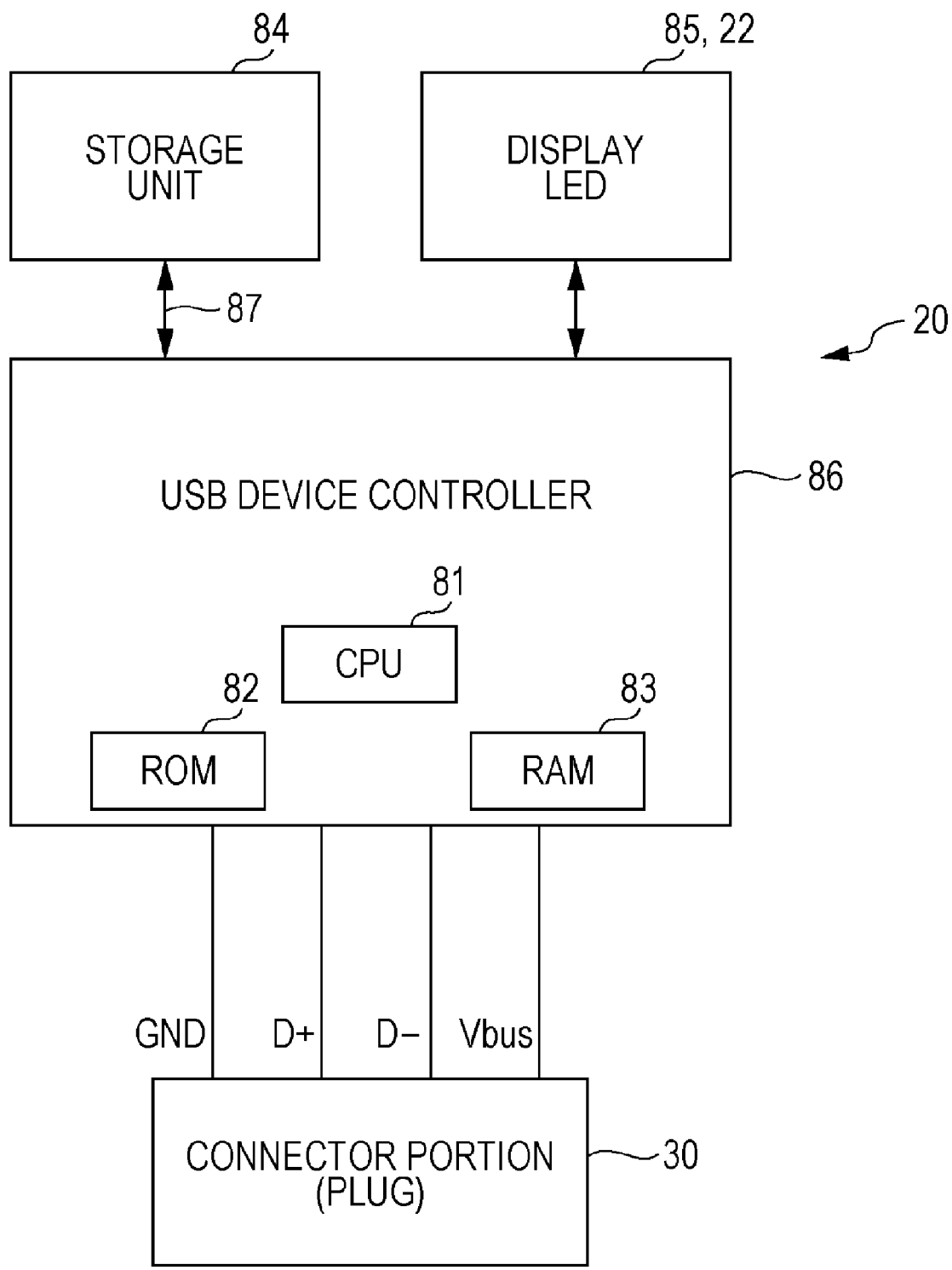
FIG. 13 is a block diagram illustrating a configuration example of a signal processing system of the USB device according to the embodiment.

FIG. 13 is a block diagram illustrating a configuration example of a signal processing system of the USB device according to the embodiment.

As shown in FIG. 13, the USB device 10 includes a CPU (Central Processing Unit) 81 controlling an operation of the overall USB device 10 in the main body portion 20.

The USB device 10 includes a USB device controller 86 which embeds a ROM (Read Only Memory) 82 storing various control programs and a RAM (Random Access Memory) 83 as a work memory therein, and a storage unit 84 constituted by a nonvolatile memory.

In addition, the USB device 10 has the above-described display LED 85 (22).

Further, the USB device controller 86 and the storage unit 84 constituted by a nonvolatile memory are connected to each other via a bus 87.

The USB device controller 86 is connected to the connector (plug) portion 30 via circuit power supply Vbus, a signal ground GND, and data communication lines D+ and D−.

The USB device controller 86 performs the following controls when the connector portion 30 of the USB device 10 is inserted into the receptacle 110 mounted on the electronic equipment 100 such as a PC.

When detecting a current supplied from the electronic equipment 100 via the power supply line Vbus of the connector portion 30 and the USB device controller 86, the USB device controller 86 pulls up the data communication lines D− and D+ of the connector portion 30.

Thereby, the USB device controller 86 realizes USB connection in a state based on the USB standard, capable of communicating with the electronic equipment 100.

When receiving a recording request from the electronic equipment 100, the USB device controller 86 sends data transmitted from the electronic equipment 100 to the storage unit 84 for storage.

On the other hand, when receiving a reading request from the electronic equipment 100, the USB device controller 86 reads designated data from the storage unit 84. In addition, the USB device controller 86 transmits the read data to the electronic equipment 100 via the connector portion 30.

As such, when the connector portion 30 is inserted into the receptacle 110 mounted on the electronic equipment 100, the USB device 10 stores data sent from the PC via the connector portion 30 in response to a request from the PC. The USB device 10 can transmit stored data to the PC.

In addition, when USB connection to the electronic equipment 100 is made, the USB device controller 86 turns on the display LED 85 by supplying a driving voltage to the display LED 85 (22).

When the USB connection state to the electronic equipment 100 is canceled (disconnected) thereafter, the USB device controller 86 turns off the display LED 85 by stopping the supply of the driving voltage to the display LED 85.

In the embodiment, an exposed ESD line having no resist layer is formed on a path via which ESD enters the USB device, thereby preventing ESD from falling on the internal circuits, and the end point of the ESD line is formed up to the connector portion 30.

Further, a hole or a notch is formed at the tip portion (front end portion) of the connector portion 30 so as to form an air layer which is connected to outside in terms of a structure, thereby lowering the breakdown field between the PCB 40 and the frame of the USB receptacle such that ESD can easily jump thereto.

Thereby, a path of ESD is formed by an ESD gun, the PCB, and the USB receptacle.

As such, resistance to ESD can be heightened in a frame which is not made of metal.

That is to say, the according to embodiment, it is possible to achieve the following effects.

By lowering the breakdown field between the PCB and the frame of the receptacle, even in a frame of the USB connector portion which is not made of metal, an ESD path is generated and thus resistance to ESD can be improved.

Although the USB device has been described as an example of a portable information processing device in the above embodiment, the present disclosure is applicable to portable information processing devices other than the USB device, for example, a memory card or the like of which a casing is made of a molded resin.

4. Outline of Overall Configuration of Another Portable Device (Memory Card)

Figure 14A:
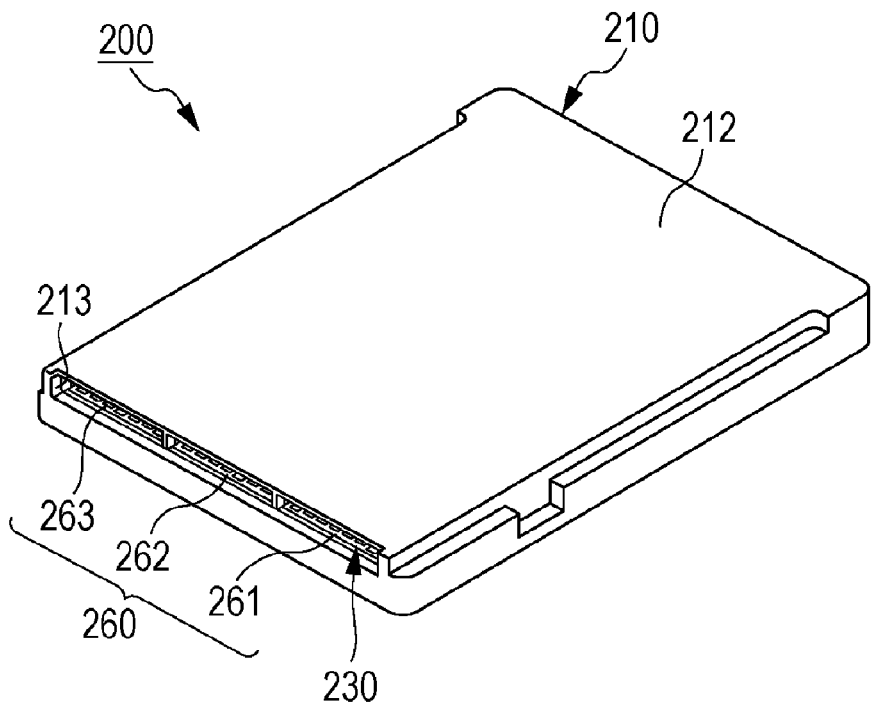
FIGS. 14A and 14B are perspective views illustrating an exterior of a memory card which is a portable information processing device according to the embodiment.
Figure 14B:
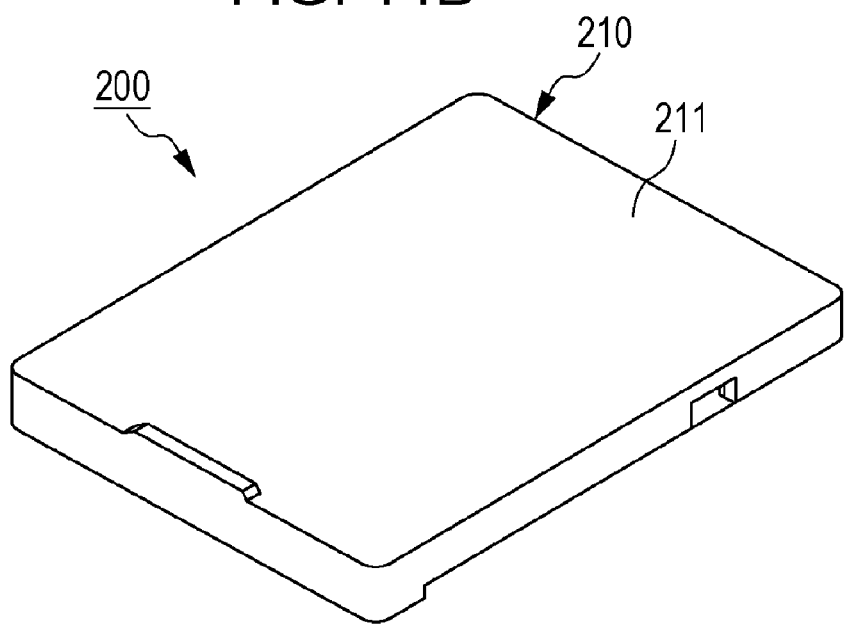

FIGS. 14A and 14B are perspective views illustrating an exterior of a card type peripheral device (memory card) which is a portable information processing device according to the embodiment. FIG. 14A is a perspective view when the card type peripheral device is viewed from a first surface side, and FIG. 14B is a perspective view when the card type peripheral device is viewed from a second surface side.

Figure 15:
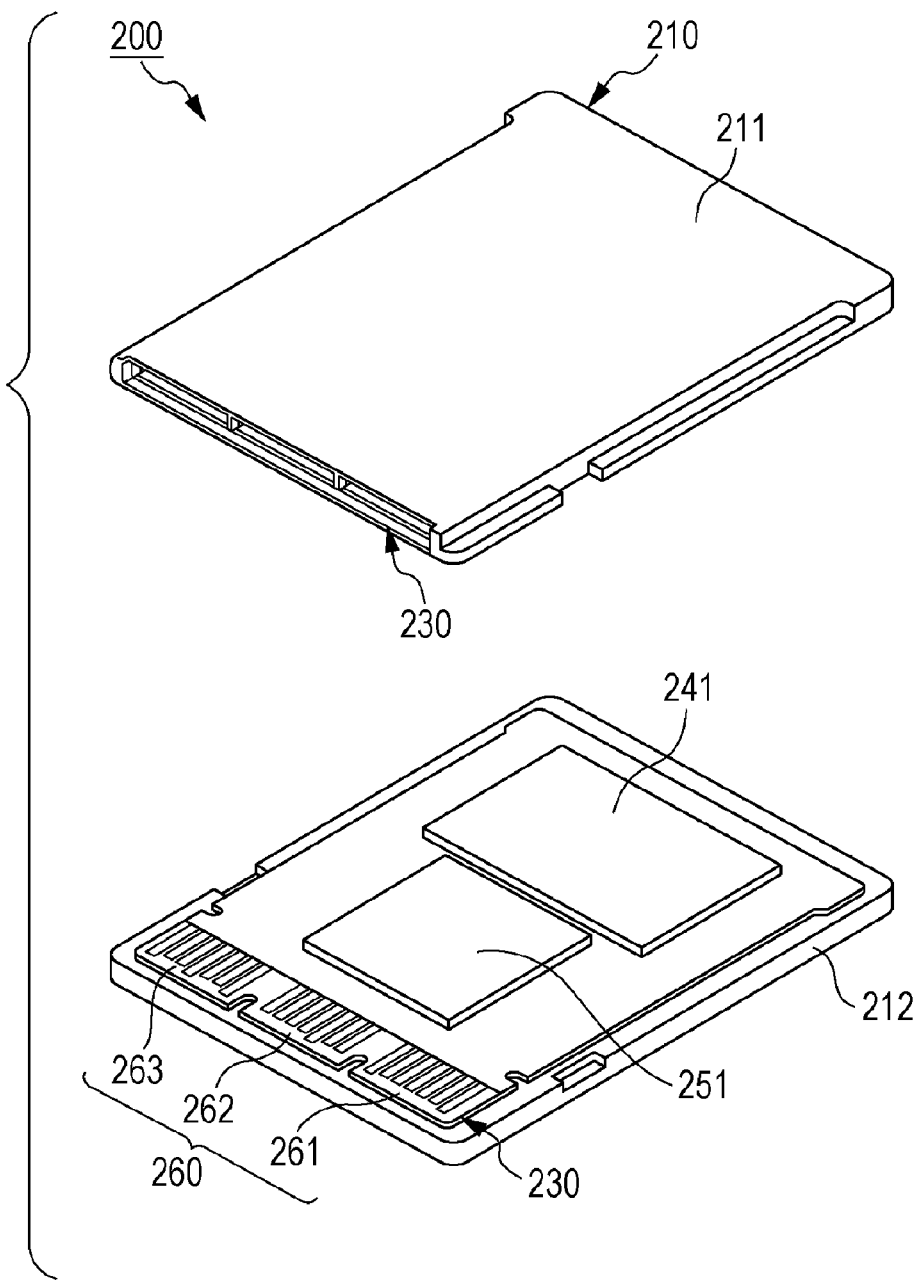
FIG. 15 is an exploded perspective view illustrating by explosion a configuration example of the memory card which is a portable information processing device according to the embodiment.

FIG. 15 is an exploded perspective view illustrating by explosion a configuration example of the memory card which is a portable information processing device according to the embodiment.

The portable information processing device 200 is configured as a memory card while maintaining compatibility of functions, the number of pins, and the like with a removable medium for a high performance mobile device such as a video camera or a digital still camera, in order to be also used as a small-sized and high density memory module.

Hereinafter, the portable information processing device 200 will be described as a memory card.

First, a basic configuration of the memory card 200 will be described.

5. Configuration Example of ESD Countermeasures for Another Portable Device (Memory Card)

The memory card 200 includes a casing 210, a circuit board portion 220 contained in the casing, a connector portion 230 formed at one end portion of the circuit board portion 220 in the longitudinal direction, and electronic circuits (components) 241 and 251 mounted on the circuit board portion 220.

The electronic circuit 241 is formed as, for example, a nonvolatile memory (flash memory), and the electronic circuit 251 is formed as a controller. In addition, the electronic circuit 241 and the like are mounted on not only one surface side (front surface side) of the circuit board portion 220 but also the other surface side (rear surface side).

The casing 210 has a first casing 211 and a second casing 212 made of an insulator such as a molded resin, formed in a cuboidal shape.

For example, the casing 210 is formed in a cuboidal shape by welding the lateral portion of the first casing 211 and the lateral portion of the second casing 212 in a state where the overall circuit board portion 220 is disposed on the inner surface of the second casing 212.

An opening portion 213 for connection to electronic equipment (not shown) is formed at the lateral portion in the longitudinal direction where the connector portion 230 is disposed in the welded state.

A plurality of terminal portions 260 of the connector portion 230 are formed at one end portion of the circuit board portion 220 in the longitudinal direction.

The terminal portions 260 include signal terminals and power supply terminals which are used for recording and reading and are arranged in a line, through access to the nonvolatile memory 241 from outside of the memory card via the controller 251.

The memory card 200 is supplied with power via contact pins of a connector of a host device (not shown) using the terminal portions 260, and thus exchanges data.

In this example, the terminal portions 260 of the connector portion 230 include first to twenty-first terminals (pins) P1 to P21.

In addition, in this example, the terminal portions 260 are divided into three groups 261, 262 and 263 by notches or the like formed on the circuit board portion 220.

FIG. 16 is a diagram illustrating an allotment example of the respective terminals (pins) of the terminal portion of the memory card 200 shown in FIGS. 14A to 15.

In the example shown in FIG. 16, the first terminal P1 is allocated to a shield ground terminal.

The second P2 to eighth terminal P8 are reserved and not used.

The ninth terminal P9 is allocated to a reset terminal, the tenth terminal P10 is allocated to a power supply terminal (3.3 V terminal), and the eleventh terminal P11 is allocated to a clock (CLK) control terminal.

The twelfth terminal P12 is allocated to a terminal for media detection and power control to media.

The thirteenth terminal P13 is allocated to a terminal for a differential reference clock REFCLK−, and the fourteenth terminal P14 is allocated to a terminal for a differential reference clock REFCLK+.

The fifteenth clock P15 is allocated to a signal ground terminal, the sixteenth terminal P16 is allocated to a terminal for differential data PERn0 output, and the seventeenth terminal P17 is allocated to a terminal for differential data PERp0 output.

The eighteenth terminal P18 is allocated to a signal ground terminal, the nineteenth terminal P19 is allocated to a terminal for differential data PETn0 input, the twentieth terminal P20 is allocated to a terminal for differential data PETp0 input, and the twenty-first terminal P21 is allocated to a signal ground terminal.

As such, in the embodiment, among the twenty-one terminals, the first terminal P1 is allocated to a shield ground terminal, and the fifteenth terminal P15, the eighteenth terminal P18, and the twenty-first terminal P21 are allocated to signal ground terminals.

In the embodiment, the shield ground terminal and the signal ground terminals are formed to be spaced from each other, and are not electrically connected to each other.

As described below, in the memory card 200, the first terminal P1 allocated to a shield ground terminal is connected to an ESD line and forms a discharge path.

Next, the circuit board portion 220 of the memory card 200 will be described.

Figure 17A:
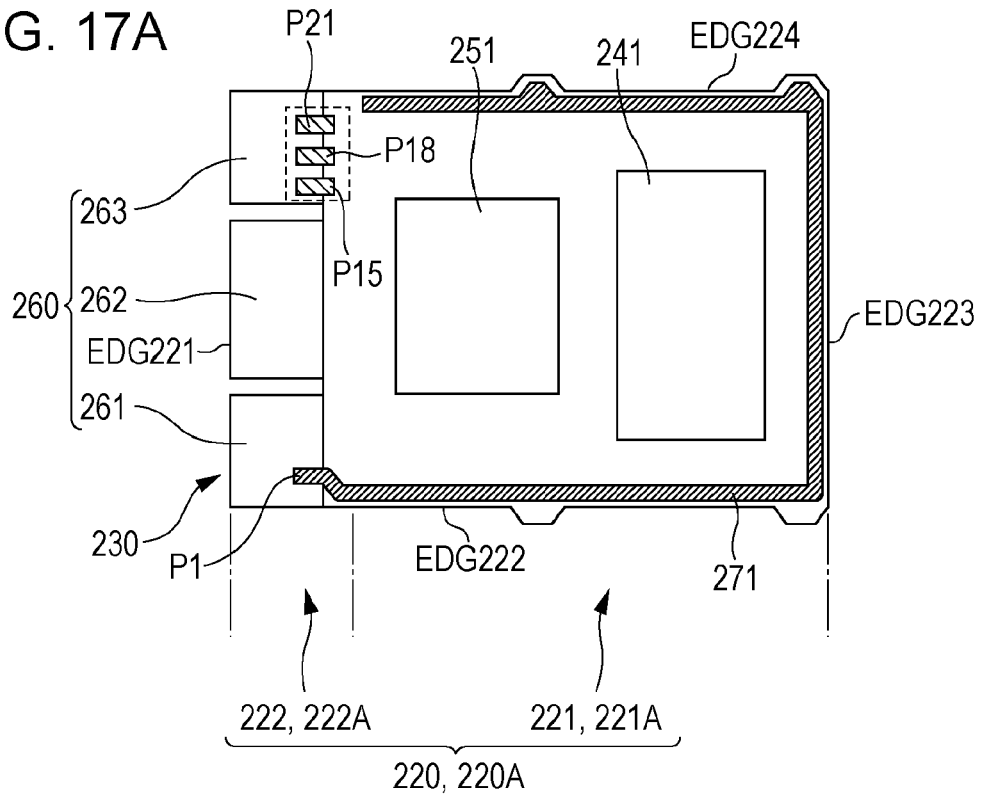
FIGS. 17A and 17B are diagrams illustrating an outline of a circuit board portion of the memory card according to the embodiment.
Figure 17B:
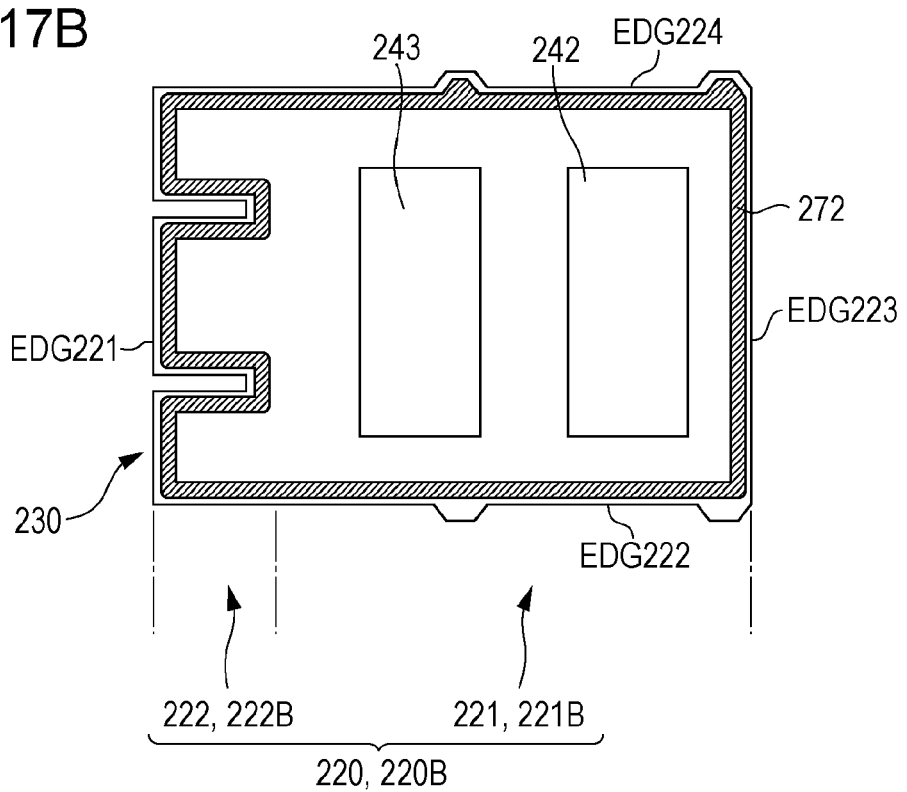

FIGS. 17A and 17B are diagrams illustrating an outline of the circuit board portion of the memory card according to the embodiment. FIG. 17A is a diagram illustrating a schematic configuration of a first surface side, and FIG. 17B is a diagram illustrating a schematic configuration of a second surface side opposite to (reverse to) the first surface side.

The circuit board portion 220 is formed by a rectangular printed circuit board (PCB).

The circuit board portion 220 has a main body portion side board 221 and a connector portion side board 222 which are integrally formed with each other. In the circuit board portion 220, the main body portion side board 221 is set to have the same with as the connector portion side board 222.

In addition, the end portion of the connector portion side board 222 in the longitudinal direction is assumed as a front portion, and the end portion of the main body portion side board 221 in the longitudinal direction is assumed as a rear portion.

In the circuit board portion 220, electronic circuits (components) 241 and 252 and the like such as semiconductor chips are mounted on the first surface (surface A) 220A of the main body portion side board 221A.

In the connector portion side board 222A, the above-described respective terminals P1 to P21 are formed in parallel at the connection portion 230 which is formed at the front edge EDG221 side.

The terminals P1 to P21 of the terminal portions 260 are divided into three groups 261, 262 and 263 by notches or the like formed on the circuit board portion 220.

The respective terminals P1 to P21 are connected to the electronic circuits of the main body portion side board 221A via connection patterns (not shown).

In FIG. 17A, the first terminal P1 which is a shield ground terminal is formed in the group 261, and the fifteenth terminal P15, the eighteenth terminal P18, and the twenty-first terminal P21 which are three signal ground terminals are formed in the group 263.

In the embodiment, the shield ground terminal and the signal ground terminals are formed to be spaced from each other, and are not electrically connected to each other.

In the main body portion side board 221A, a first ESD line 271 which functions as an ESD surge arrester is formed in a pattern exposed state where there is no resist layer, along the edge portions EDG222 to EDG224 of the board 221A, so as to surround the region mounting the electronic circuits (components) 241 and 251, and the like.

In addition, in the first surface 220A, an ESD line is not formed on the connector portion side board 222A; however, the first terminal P1 which is a shield ground is connected to the end portion of the front portion side of the first ESD line 271 located along the edge EDG222.

In the second surface (surface B) 220B of the circuit board portion 220, electronic circuits (components) 242 and 243 and the like such as semiconductor chips are mounted on the main body portion side board 221B, and the above-described terminals of the connector portion 230 are not formed on the connector portion side board 222B.

In the main body portion side board 221B, a second ESD line 272 which functions as an ESD surge arrester is formed along the edge portions EDG221 to EDG224 of the board 221B, so as to surround the region mounting the electronic circuits (components) 242 and 243, and the like.

The second ESD line 272 is formed in a pattern exposed state where there is no resist layer in the same manner as the first ESD line 271.

The ESD line 271 on the first surface 220A and the ESD line 272 on the second surface 220B of the circuit board portion 220 are connected circuit-like (electrically) to each other via a through-hole (not shown).

FIG. 18 is a diagram illustrating an assembling process of the memory card according to the embodiment.

In the memory card 200, the first casing 211 and the second casing 212 which are made of, for example, polycarbonate, are integrated into one module with the circuit board portion (PCB) 220 interposed therebetween by welding contact sides between the lateral portion of the first casing 211 and the later portion of the second casing 212.

Static electricity enters inside of the casing 210 via a gap of the welded portion. The end surface of the circuit board portion (PCB) 220 is present inside the gap of the welded portion.

A shield ground is provided here such that static electricity entering the inside is made to fall thereon, and, if the circuits are not connected to other wires, the circuits are not influenced by the static electricity.

In the embodiment, from the pin arrangement of the connector portion 230, the three terminals P15, P18 and P21 which mainly aim at protecting signal lines are allocated to signal grounds, and the first terminal P1 which is completely independent from other terminals is allocated to a shield ground.

The memory card 200 is configured such that static electricity coming from outside is received by the shield ground.

As such, the breakdown field of air is lower than that of polycarbonate.

In other words, a path where static electricity enters the inside of the casing 210 can be substantially specified to the gap of the welded portion rather than transmission of the static electricity of polycarbonate which is a material of the casing, and thus it is possible to expect improvement in resistance to static electricity by performing the above-described static electricity countermeasure for the circuit board portion (PCB) 220 which the static electricity has entered.

More specifically, as described above, the breakdown field is 30 kV or more at polycarbonate, and thus the breakdown field of air is ⅛ time or less that of polycarbonate. In other words, a path where static electricity enters the inside of the casing 210 can be substantially specified to the gap of the welded portion rather than transmission of the static electricity of polycarbonate which is a material of the casing, and thus it is possible to expect improvement in resistance to static electricity by performing the above-described static electricity countermeasure for the PCB which the static electricity has entered.

In addition, the same theory is also applicable to generic plastic.

By employing this configuration, damage or operation errors due to static electricity entering inside of the casing from outside can be prevented as much as possible, and thereby it is possible to expect improvement in quality of a memory card.

Therefore, since a casing, which does not use a metal frame, is made of only inexpensive polycarbonate, component and manufacturing costs can be reduced.

In addition, the present disclosure may have the following configuration.

(1) A portable information processing device includes a circuit board portion that has a main body portion side board mounting an electronic circuit thereon and forming a main body portion, and a connector portion side board forming a connector portion for connection to electronic equipment, wherein the main body portion side board of the circuit board portion mounts an electronic circuit on at least one of a first surface and a second surface opposite to the first surface, and is provided with a main body portion side electro-static discharge line which functions as an electro-static discharge surge arrester at an edge portion of a surface on which at least an electronic circuit is mounted, and wherein the connector portion side board of the circuit board portion is provided with a connector portion side electro-static discharge line which is connected to the main body portion side electro-static discharge line and functions as an electro-static emission portion, on at least one of the first surface and the second surface.

(2) The portable information processing device may further include an insulating support casing that supports the connector portion side board from one surface side. In this case, the connector portion side electro-static discharge line may be formed on the second surface. Further, a discharge path may be formed between at least a part of the connector portion side electro-static discharge line and an air layer which leads to outside via the insulating support casing.

(3) The discharge path may include a hole which is formed in the connector portion side board in the vicinity of a tip portion of the connector portion side electro-static discharge line, and an air layer which communicates with the hole and leads to outside of the support casing.

(4) The support casing may be also disposed at a tip surface side of the connector portion side board. In this case, the discharge path may include a notch which is formed at a tip portion of the connector portion side board in the vicinity of the connector portion side electro-static discharge line, and an air layer which communicates with the notch and leads to outside of the support casing.

(5) A connection portion of electronic equipment which is a connection target device may have a housing which guides insertion or removal of an opening portion of the connector portion. In this case, an end portion of the support casing may come into contact with a lateral surface which is present in the insertion direction inside the housing, and the discharge path may lead to the lateral surface.

(6) The discharge path may include a hole which is formed in the support casing from a part of the connector portion side electro-static discharge line which leads to outside.

(7) A connection portion of electronic equipment which is a connection target device may have a housing which guides insertion or removal of an opening portion of the connector portion. In this case, the housing may include a conductive locking portion which locks at least a part of the support casing therein in the insertion direction of the connector portion. Further, the discharge path may include a hole which is formed in the support casing from the connector portion side electro-static discharge line located at a position corresponding to the locking portion which leads to the locking portion when the connector portion is connected to the connection portion of electronic equipment.

(8) The main body portion side board of the circuit board portion may mount electronic circuits on the first surface and the second surface. Further, a first connector portion side electro-static discharge line which functions as an electro-static discharge emission portion may be formed at an edge portion of the first surface. In addition, a second connector portion side electro-static discharge line which is connected circuit-like to the first electro-static discharge line and functions as an electro-static discharge emission portion may be formed at an edge portion of the second surface. In this case, the connector portion side board of the circuit board portion may be provided with a connector portion side electro-static discharge line which is connected to the main body portion side electro-static discharge line and functions as an electro-static discharge emission portion, on the second surface of at least one of two edges located at sides perpendicular to a direction where the connector portion is inserted into or removed from the electronic equipment.

(9) The connector portion side board of the circuit board portion is provided with connection terminals including a ground terminal on the first surface. In this case, the main body portion side board of the circuit board portion may be connected to the main body portion side electro-static discharge line on the first surface. Further, the ground terminal may be connected to the main body portion side electro-static discharge line as the connector portion side electro-static discharge line.

(10) The connection terminals may include a shield ground terminal and a signal ground terminal. In this case, the shield ground terminal may be connected to the main body portion side electro-static discharge line as the connector portion side electro-static discharge line.

The present disclosure contains subject matter related to that disclosed in Japanese Priority Patent Application JP 2010-228900 filed in the Japan Patent Office on Oct. 8, 2010 and Japanese Priority Patent Application JP 2011-096260 filed in the Japan Patent Office on Apr. 22, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A portable information processing device comprising:
   a circuit board portion that has a main body portion side board mounting an electronic circuit thereon and forming a main body portion, and a connector portion side board forming a connector portion for connection to electronic equipment,
   wherein the main body portion side board of the circuit board portion mounts an electronic circuit on at least one of a first surface and a second surface opposite to the first surface, and is provided with a main body portion side electro-static discharge line which functions as an electro-static discharge surge arrester at an edge portion of a surface on which at least an electronic circuit is mounted, and
   wherein the connector portion side board of the circuit board portion is provided with a connector portion side electro-static discharge line which is connected to the main body portion side electro-static discharge line and functions as an electro-static emission portion, on at least one of the first surface and the second surface.

2. The portable information processing device according to claim 1, further comprising an insulating support casing that supports the connector portion side board from one surface side,
   wherein the connector portion side electro-static discharge line is formed on the second surface, and
   wherein a discharge path is formed between at least a part of the connector portion side electro-static discharge line and an air layer which leads to outside via the insulating support casing.

3. The portable information processing device according to claim 2, wherein the discharge path includes a hole which is formed in the connector portion side board in the vicinity of a tip portion of the connector portion side electro-static discharge line, and an air layer which communicates with the hole and leads to outside of the support casing.

4. The portable information processing device according to claim 2, wherein the support casing is also disposed at a tip surface side of the connector portion side board, and
   wherein the discharge path includes a notch which is formed at a tip portion of the connector portion side board in the vicinity of the connector portion side electro-static discharge line, and an air layer which communicates with the notch and leads to outside of the support casing.

5. The portable information processing device according to claim 2, wherein a connection portion of electronic equipment which is a connection target device has a housing which guides insertion or removal of an opening portion of the connector portion, and
   wherein an end portion of the support casing comes into contact with a lateral surface which is present in the insertion direction inside the housing, and the discharge path leads to the lateral surface.

6. The portable information processing device according to claim 2, wherein the discharge path includes a hole which is formed in the support casing from a part of the connector portion side electro-static discharge line which leads to outside.

7. The portable information processing device according to claim 2, wherein a connection portion of electronic equipment which is a connection target device has a housing which guides insertion or removal of an opening portion of the connector portion, wherein the housing includes a conductive locking portion which locks at least a part of the support casing therein in the insertion direction of the connector portion, and wherein the discharge path includes a hole which is formed in the support casing from the connector portion side electro-static discharge line located at a position corresponding to the locking portion which leads to the locking portion when the connector portion is connected to the connection portion of electronic equipment.

8. The portable information processing device according to claim 2, wherein the main body portion side board of the circuit board portion mounts electronic circuits on the first surface and the second surface, wherein a first connector portion side electro-static discharge line which functions as an electro-static discharge emission portion is formed at an edge portion of the first surface, wherein a second connector portion side electro-static discharge line which is connected to the first electro-static discharge line in a circuital way and functions as an electro-static discharge emission portion is formed at an edge portion of the second surface, and wherein the connector portion side board of the circuit board portion is provided with a connector portion side electro-static discharge line which is connected to the main body portion side electro-static discharge line and functions as an electro-static discharge emission portion, on the second surface of at least one of two edges located at sides perpendicular to a direction where the connector portion is inserted into or removed from the electronic equipment.

9. The portable information processing device according to claim 1, wherein the connector portion side board of the circuit board portion is provided with connection terminals including a ground terminal on the first surface, wherein the main body portion side board of the circuit board portion is connected to the main body portion side electro-static discharge line on the first surface, and wherein the ground terminal is connected to the main body portion side electro-static discharge line as the connector portion side electro-static discharge line.

10. The portable information processing device according to claim 9, wherein the connection terminals include a shield ground terminal and a signal ground terminal, and wherein the shield ground terminal is connected to the main body portion side electro-static discharge line as the connector portion side electro-static discharge line.

* * * * *